United States Patent
Wu et al.

(10) Patent No.: US 9,318,488 B2
(45) Date of Patent: Apr. 19, 2016

(54) SEMICONDUCTOR DEVICE AND FORMATION THEREOF

(71) Applicant: Taiwan Semiconductor Manufacturing Company Limited, Hsin-Chu (TW)

(72) Inventors: I-Wen Wu, Hsinchu (TW); Mei-Yun Wang, Chu-Pei (TW); Hsien-Cheng Wang, Hsinchu (TW); Shih-Wen Liu, Taoyuan (TW); Hsiao-Chiu Hsu, Hsinchu (TW); Hsin-Ying Lin, Tainan (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 14 days.

(21) Appl. No.: 14/147,851

(22) Filed: Jan. 6, 2014

(65) Prior Publication Data
US 2015/0194425 A1    Jul. 9, 2015

(51) Int. Cl.
*H01L 27/088* (2006.01)
*H01L 29/06* (2006.01)
*H01L 21/8234* (2006.01)
*H01L 21/762* (2006.01)

(52) U.S. Cl.
CPC ...... *H01L 27/0886* (2013.01); *H01L 21/76224* (2013.01); *H01L 21/823431* (2013.01); *H01L 21/823481* (2013.01); *H01L 29/0653* (2013.01)

(58) Field of Classification Search
CPC .................................................. H01L 27/0086
See application file for complete search history.

(56) References Cited

U.S. PATENT DOCUMENTS

| 5,766,992 | A  | * | 6/1998  | Chou et al. ..................... 438/241 |
| 6,559,055 | B2 | * | 5/2003  | Tuan et al. ..................... 438/692 |
| 7,160,780 | B2 | * | 1/2007  | Lee ..................... H01L 29/7851 257/E21.178 |
| 8,026,138 | B2 | * | 9/2011  | Lee ..................... H01L 27/10876 257/E27.095 |
| 2004/0067611 | A1 | | 4/2004 | Juengling |
| 2005/0142750 | A1 | | 6/2005 | Jung |
| 2014/0001562 | A1 | * | 1/2014 | Liaw ................. H01L 21/82341 257/369 |
| 2015/0129980 | A1 | * | 5/2015 | Wang ................ H01L 29/66795 257/401 |

OTHER PUBLICATIONS

Corresponding Taiwanese application, Taiwanese Office action dated Feb. 22, 2016, 6 pages.

* cited by examiner

*Primary Examiner* — Lex Malsawma
(74) *Attorney, Agent, or Firm* — Cooper Legal Group, LLC

(57) ABSTRACT

A semiconductor device and method of formation are provided herein. A semiconductor device includes a first active region adjacent a first side of a shallow trench isolation (STI) region. The first active region including a first proximal fin having a first proximal fin height adjacent the STI region, and a first distal fin having a first distal fin height adjacent the first proximal fin, the first proximal fin height less than the first distal fin height. The STI region includes oxide, the oxide having an oxide volume, where the oxide volume is inversely proportional to the first proximal fin height. A method of formation includes forming a first proximal fin with a first proximal fin height less than a first distal fin height of a first distal fin, such that the first proximal fin is situated between the first distal fin and an STI region.

20 Claims, 9 Drawing Sheets

US 9,318,488 B2

SEMICONDUCTOR DEVICE AND FORMATION THEREOF

BACKGROUND

In a semiconductor device, current flows through a channel region between a source region and a drain region upon application of a sufficient voltage or bias to a gate of the device. When current flows through the channel region, the device is generally regarded as being in an 'on' state, and when current is not flowing through the channel region, the device is generally regarded as being in an 'off' state.

DETAILED DESCRIPTION

Figure 1:
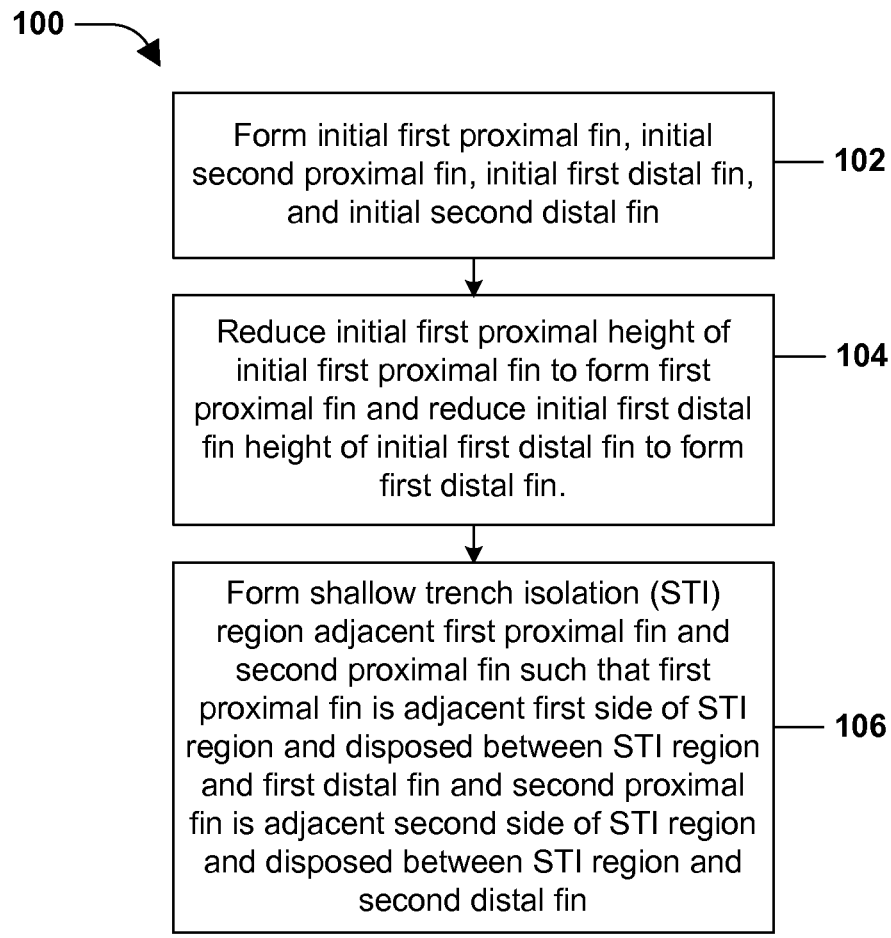
FIG. 1 is a flow diagram illustrating a method of forming a semiconductor device, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

According to some embodiments a semiconductor device comprises a first active region adjacent a first side of a shallow trench isolation (STI) region, and a second active region adjacent a second side of the STI region. According to some embodiments, the first active region comprises a first proximal fin adjacent the STI region, having a first proximal fin height, and a first distal fin adjacent the first proximal fin, having a first distal fin height, the first distal fin height greater than the first proximal fin height. In some embodiments, the first proximal fin is disposed between the STI region and the first distal fin. According to some embodiments, the second active region comprises a second proximal fin adjacent the STI region, having a second proximal fin height, and a second distal fin adjacent the second proximal fin, having a second distal fin height. In some embodiments, the second proximal fin is disposed between the STI region and the second distal fin. In some embodiments, the second distal fin height is greater than the second proximal fin height. In some embodiments, the second proximal fin is disposed between the STI region and the second distal fin.

According to some embodiments, a semiconductor device as provided herein is useful for forming an oxide in an STI region, the oxide having an oxide volume that is large enough to mitigate signal delays from coupling between adjacent active regions and increase a processing window of the semiconductor device by increasing a distance between an active region and a metal contact connected to a gate over the active region. In some embodiments, the metal contact is connected to the gate in the STI region. In some embodiments, the gate is over the first active region, the STI region and the second active region, and in contact with an epitaxial (Epi) layer of first active region and an Epi layer of the second active region. In some embodiments, the STI region comprises an oxide having an oxide volume that is inversely proportional to the first proximal fin height. In some embodiments, the oxide volume is between about 1.1 to about 1.5 times greater than a second oxide volume of the oxide, where the second oxide volume corresponds to the first proximal fin having the first distal fin height. In some embodiments, the oxide has an oxide height that is substantially equal to a difference between a first proximal fin height and the first distal fin height. In some embodiments, the Epi layer is over the first proximal fin, the first distal fin, the second proximal fin, and the second distal fin.

According to some embodiments, forming a semiconductor device comprises forming a first active region adjacent a first side of a shallow trench isolation (STI) region, and a second active region adjacent a second side of the STI region, and forming the STI region.

In some embodiments, forming the first active region comprises forming an initial first proximal fin having an initial first proximal fin height and an initial first distal fin having an initial first distal fin height. In some embodiments, forming the first active region comprises reducing the initial first proximal fin height to form a first proximal fin and reducing an initial first distal fin height to form a first distal fin, the first proximal fin height less than the first distal fin height. In some embodiments, forming the second active region comprises forming an initial second proximal fin having an initial proximal fin height and an initial second distal fin having an initial second distal fin height. In some embodiments, forming the second active region comprises reducing an initial second proximal fin height to form a second proximal fin and reducing the initial second distal fin height to form a second distal fin, the second proximal fin height less than the second distal fin height. In some embodiments, the STI region is formed proximate the first proximal fin, such that the first proximal fin is adjacent a first side of the STI region and is disposed between the STI region and the first distal fin. In some embodiments, the STI region comprises an oxide having an oxide volume which is inversely proportional to the first proximal fin height, such that the oxide volume increases as the first proximal fin height decreases.

A method 100 of forming a semiconductor device 200 is illustrated in FIG. 1, and the semiconductor device at various stages of fabrication is illustrated in FIGS. 2-21. As illustrated in FIG. 13, the semiconductor device comprises a first proximal fin 252 having a first proximal fin height 226, adjacent a first distal fin 254, having a first distal fin height 224, the first proximal fin height 226 less than the first distal fin height 224. The first proximal fin 252 is adjacent a STI region 209, such that the first proximal fin 252 is disposed between the first distal fin 254 and the STI region 209. According to some embodiments, an active region 205 comprises the first proximal fin 252 and the first distal fin 254.

Figure 2:
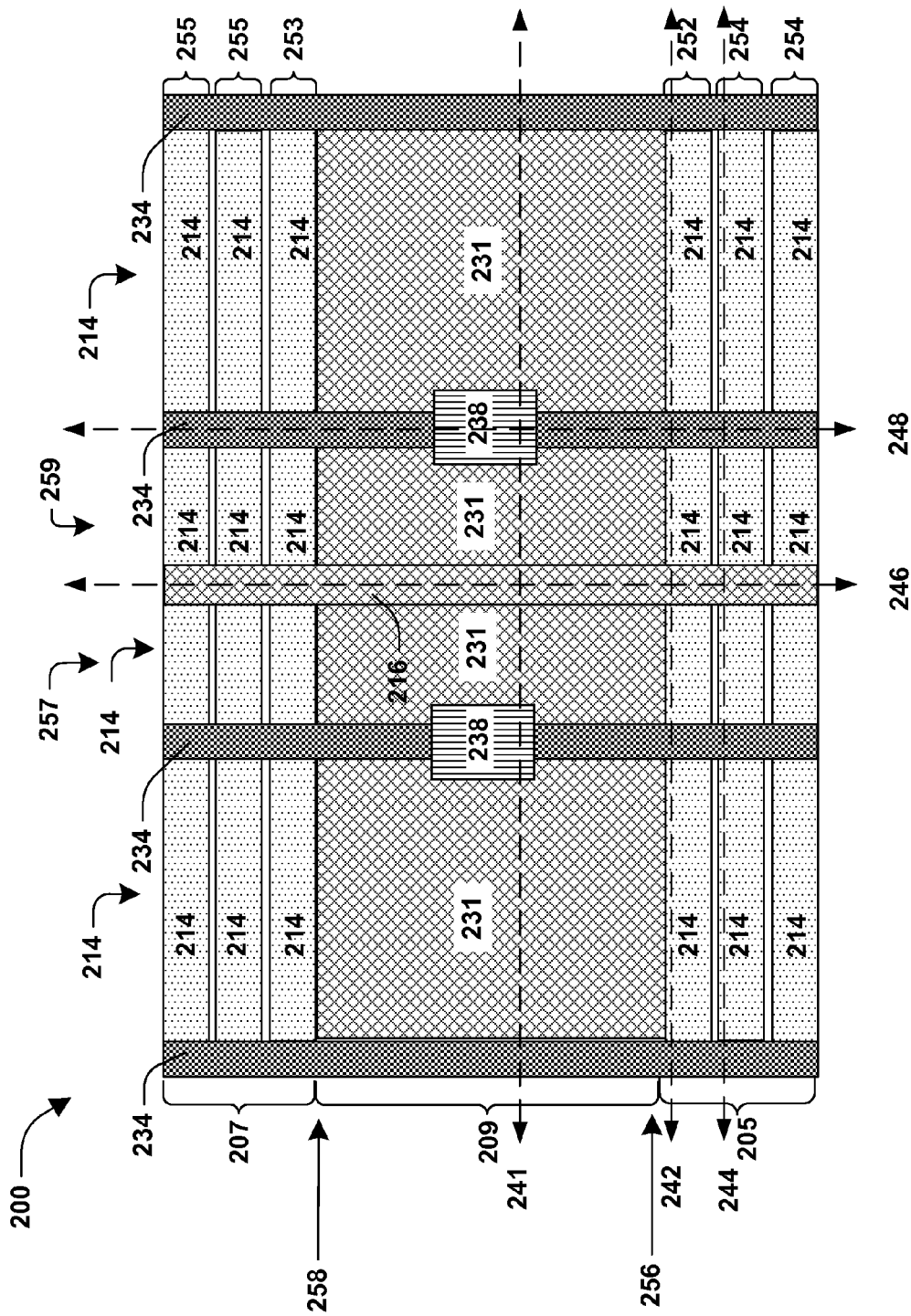
FIG. 2 is an illustration of a semiconductor device, according to some embodiments.
Figure 17:
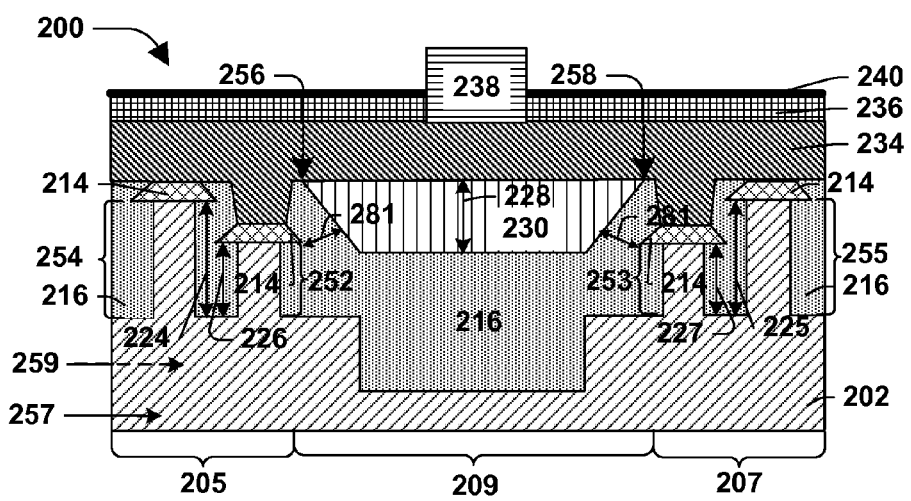
FIG. 17 is an illustration of a semiconductor device, according to some embodiments.
Figure 18:
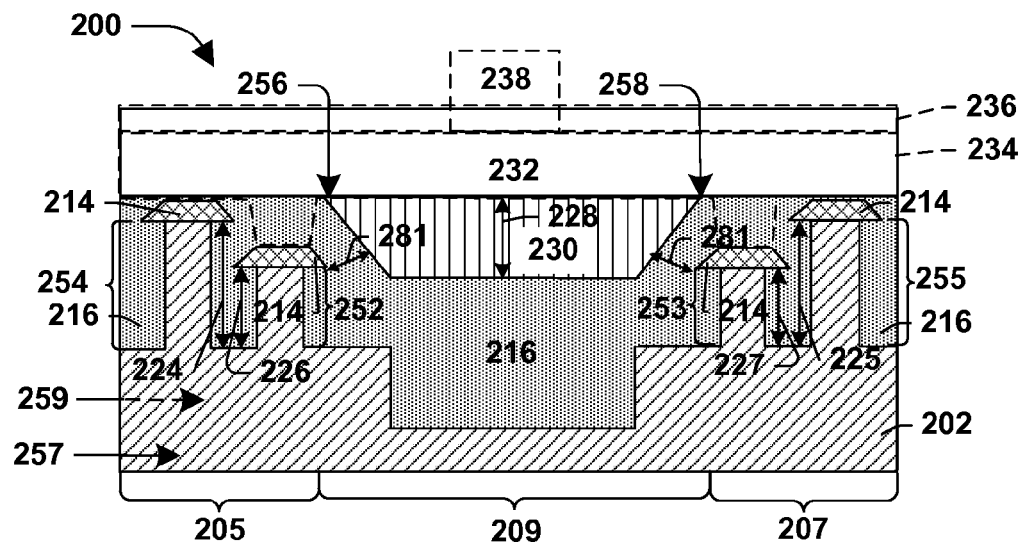
FIG. 18 is an illustration of a semiconductor device, according to some embodiments.
Figure 19:
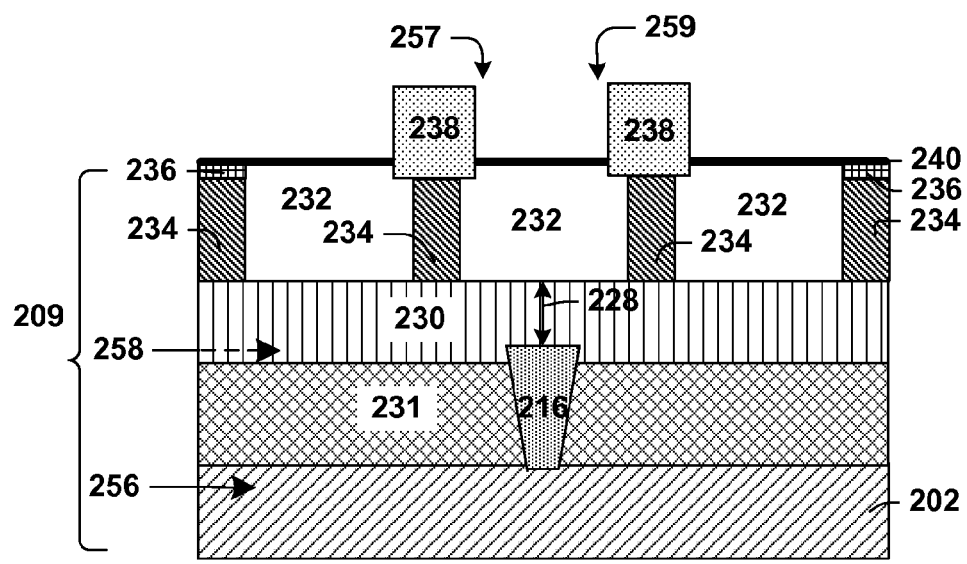
FIG. 19 is an illustration of a semiconductor device, according to some embodiments.
Figure 20:
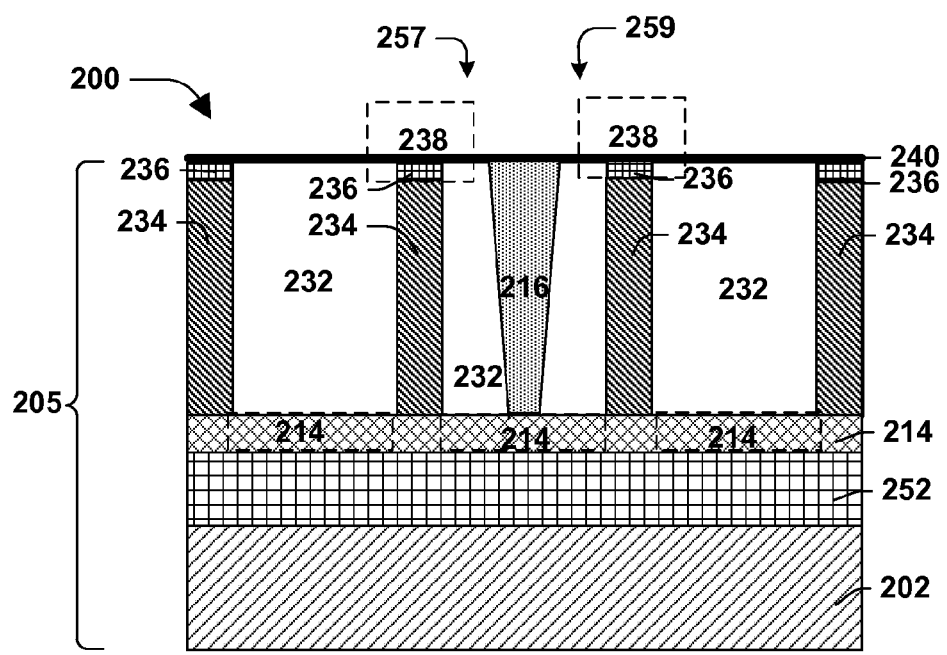
FIG. 20 is an illustration of a semiconductor device, according to some embodiments.
Figure 21:
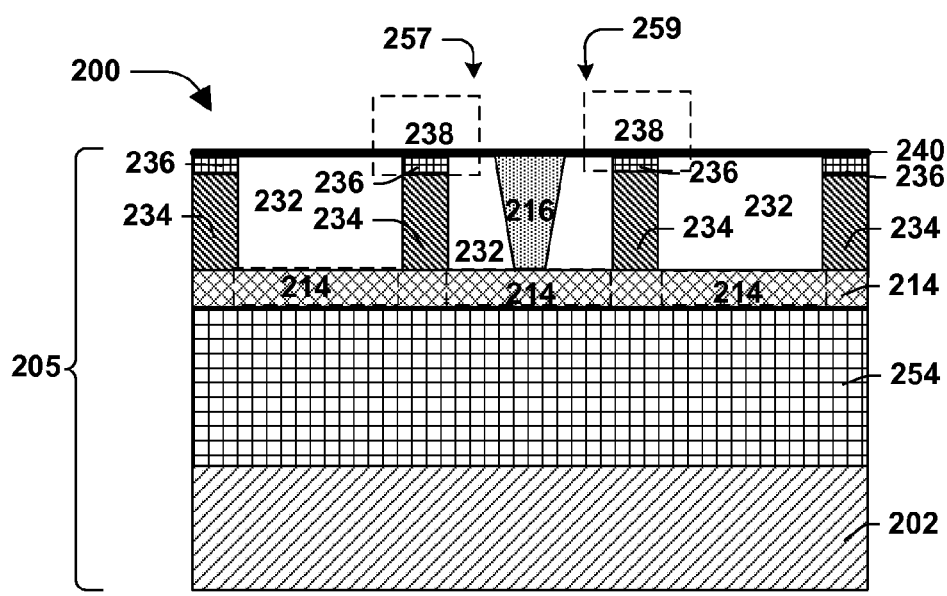
FIG. 21 is an illustration of a semiconductor device, according to some embodiments.

Turning to FIG. 2 an overview or top down view of the semiconductor device 200 is illustrated, according to some embodiments, where a dielectric 232, a hard mask 236 and an etch stop layer 240 illustrated in FIGS. 18, 19, 20 and 21 are not shown in FIG. 2 so that features underlying the dielectric 232, the hard mask 236 and the etch stop layer 240 are visible in FIG. 2. FIGS. 3-21 illustrate various cross-sections of FIG. 2. In FIG. 2 five lines 246, 241, 242, 244 and 248 are drawn to illustrate cross-sections that are depicted in other Figs. A first line 246, cuts through a metal connect 216, according to some embodiments, where the metal connect 216 is formed to connect the first active region 205 to the second active region 207. FIGS. 3-13 and 18 are cross sectional views of the semiconductor arrangement 200 taken along the first line 246 at various stages of fabrication. A second line 248 cuts through a gate 234 and a metal contact 238 according to some embodiments where the gate 234 is formed over the first active region 205, the STI region 209 and the second active region 207. FIGS. 14-17 are cross sectional views of the semiconductor arrangement 200 taken along the second line 248 at various stages of fabrication. A third line 241 cuts through the STI region 209, the metal connect 216, an STI 231 adjacent a first side 257 of the metal connect 216 and STI 231 adjacent a second side 259 of the metal connect 216 and the metal contacts 238 over the gate 234, according to some embodiments. FIG. 19 is a cross sectional view of the semiconductor arrangement 200 taken along the third line 241 at a latter stage of fabrication. A fourth line 242 cuts through the first proximal fin 252, according to some embodiments. FIG. 20 is a cross sectional view of the semiconductor arrangement 200 taken along the fourth line 242 at a latter stage of fabrication. A fifth line 244 cuts through the first distal fin 254, according to some embodiments. FIG. 21 is a cross sectional view of the semiconductor arrangement 200 taken along the fifth line 244 at a latter stage of fabrication.

Figure 3:
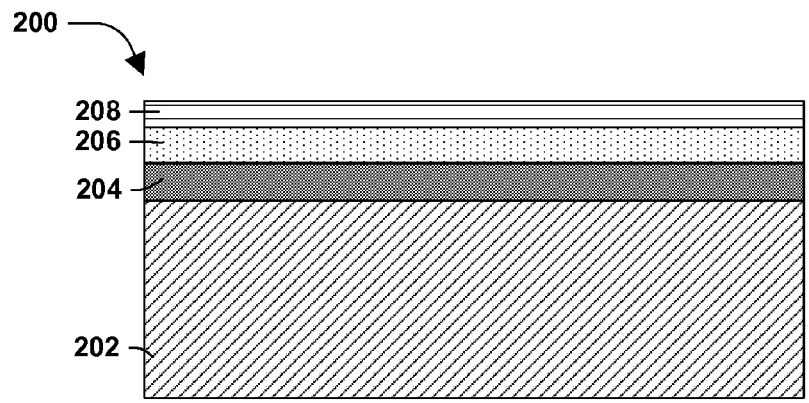
FIG. 3 is an illustration of a semiconductor device, according to some embodiments.
Figure 4:
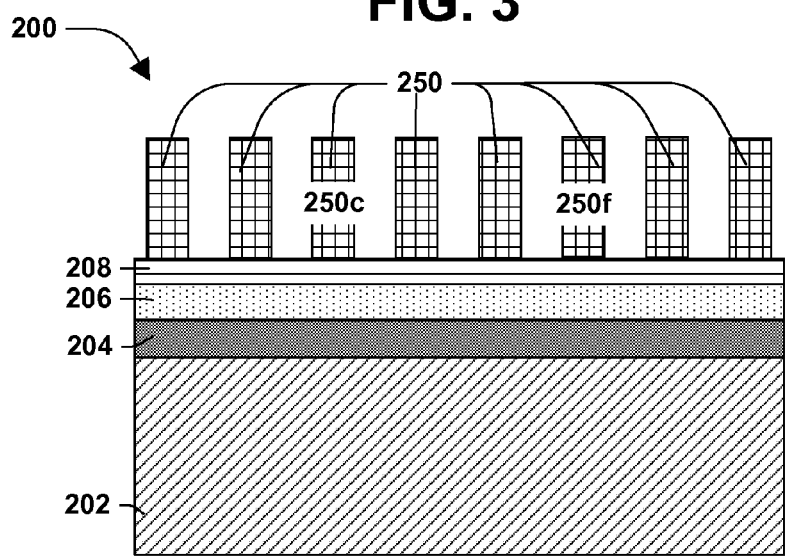
FIG. 4 is an illustration of a semiconductor device, according to some embodiments.
Figure 5:
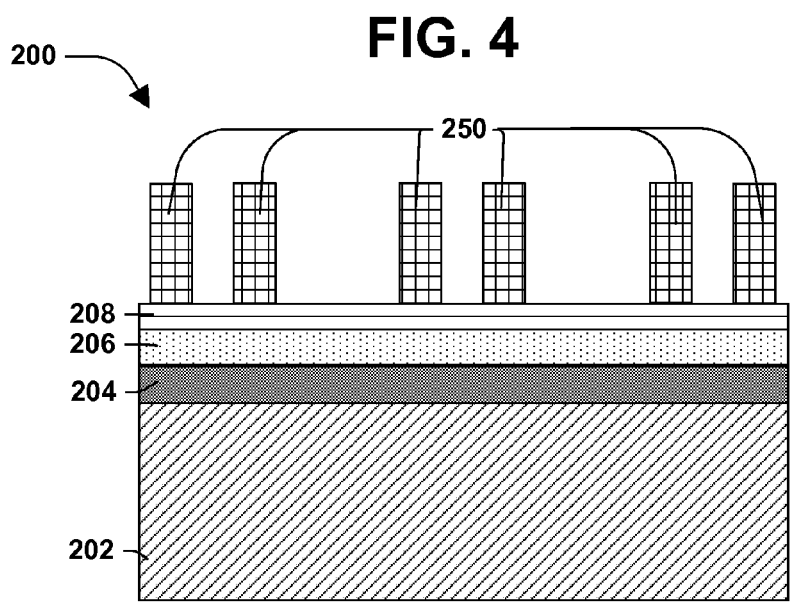
FIG. 5 is an illustration of a semiconductor device, according to some embodiments.
Figure 6:
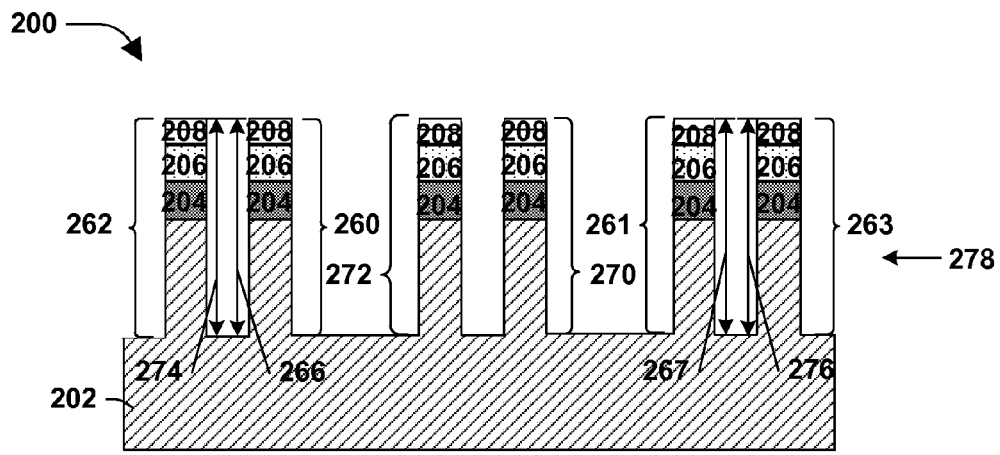
FIG. 6 is an illustration of a semiconductor device, according to some embodiments.

At 102, an initial first proximal fin 260, an initial second proximal fin 261, an initial first distal fin 262, and an initial second distal fin 263 are formed, as illustrated in FIG. 6. Turning to FIG. 3, a pad oxide 204 is formed over a substrate 202. In some embodiments, the substrate 202 comprises at least one of a silicon oxide or a silicon nitride. According to some embodiments, the substrate 202 comprises at least one of an epitaxial layer, a silicon-on-insulator (SOI) structure, a wafer, or a die formed from a wafer. In some embodiments, the substrate 202 has a thickness between about 50 nm to about 500 nm. In some embodiments, the pad oxide 204 comprises an oxide. In some embodiments, the pad oxide 204 is at least one of grown or deposited. In some embodiments, the pad oxide 204 has a thickness between about 2.5 nm to about 15 nm. In some embodiments, a nitride layer 206 is formed over the pad oxide 204. In some embodiments, the nitride layer 206 comprises at least one of a silicon or a nitride. In some embodiments, the nitride layer 206 is grown or deposited. In some embodiments, the nitride layer 206 has a thickness between about 2.5 nm to about 15 nm. In some embodiments, an oxide layer 208 is formed over the nitride layer 206. In some embodiments, the oxide layer 208 comprises an oxide. In some embodiments, the oxide layer 208 is at least one of deposited or grown. In some embodiments, the oxide layer 208 has a thickness between about 2.5 nm to about 15 nm. In some embodiments, spacers 250 are formed over the oxide layer 208, as illustrated in FIG. 4. In some embodiments, the spacers 250 function as a mask, such that the oxide layer 208, the nitride layer 206, the pad oxide 204 and the substrate 202 are etched into fins. In some embodiments, the spacers 250 comprise at least one of an oxide or a nitride. In some embodiments, the spacers 250 have a width between about 0.5 nm to about 15 nm. In some embodiments, the third spacer 250c and the seventh spacer 250f are removed, such as by etching, before the fins are formed, as illustrated in FIG. 5. In some embodiments, initial fins 278 are formed from the oxide layer 208, the nitride layer 206, the pad oxide 204 and the substrate 202, such as by etching, as illustrated in FIG. 6. In some embodiments, the initial fins 278 are capped with a nitride, such as silicon nitride (not shown), such that the silicon nitride has a thickness of about 2.5 nm to about 7.5 nm. In some embodiments, an initial first distal fin 262, an initial first proximal fin 260, an initial first central fin 272, an initial second central fin 270, an initial second proximal fin 261 and an initial second distal fin 263 are formed, such as by etching. In some embodiments, the spacers 250 are removed after the initial fins 278 are formed. In some embodiments, the initial first distal fin 262 has an initial first distal fin height 274 and the initial second distal fin 263 has an initial second distal fin height 276. In some embodiments, the initial first distal fin height 274 and the initial second distal fin height 276 are substantially the same. In some embodiments, the initial first distal fin height 274 and the initial second distal fin height 276 have a height between about 25 nm to about 90 nm. In some embodiments, the initial first distal fin height 274 and the initial second distal fin height 276 are different heights. In some embodiments, the initial first proximal fin 260 has an initial first proximal fin height 266 and the initial second proximal fin 261 has an initial second proximal fin height 267. In some embodiments, the initial first proximal fin height 266 and the initial second proximal fin height 267 are substantially the same. In some embodiments, the initial first proximal fin height 266 has a height between about 25 nm to about 65 nm. In some embodiments, the initial first proximal fin height 266 and the initial second proximal fin height 267 are different heights.

Figure 7:
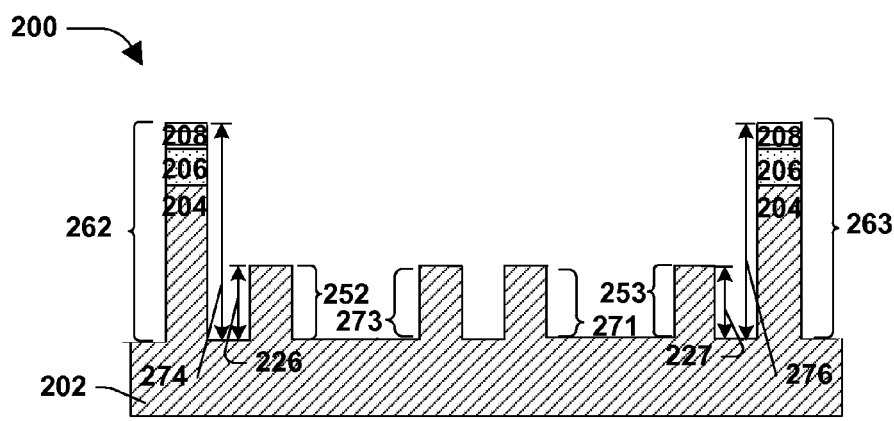
FIG. 7 is an illustration of a semiconductor device, according to some embodiments.
Figure 8:
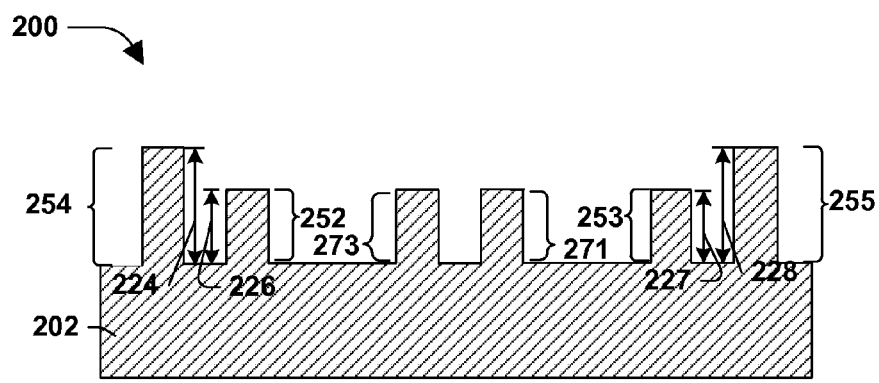
FIG. 8 is an illustration of a semiconductor device, according to some embodiments.

At 104, the initial first proximal fin height 266 of the initial first proximal fin 260 is reduced, such as by etching, to form a first proximal fin 252 having a first proximal fin height 226, as illustrated in FIG. 7. In some embodiments, the initial second proximal fin height 267 is reduced, such as by etching, to form a second proximal fin 253 having a second proximal fin height 227. In some embodiments, a mask layer (not shown) is formed over the initial first distal fin 262 and the initial second distal fin 263 when forming the first proximal fin 252 and the second proximal fin 253. In some embodiments, the first proximal fin height 226 and the second proximal fin height 227 are between 5 nm to about 45 nm. In some embodiments, the initial first central fin 272 has an initial first central fin height and the initial second central fin 270 has an initial second fin height, the initial first central fin height and the initial second central fin height are substantially equal to the initial first proximal fin height 266. In some embodiments, the initial first central fin height and the initial second central fin height are reduced, such as by etching, to from a first central fin 273 and a second central fin 271, such that the first central fin 273 has a first central fin height and the second central fin 271 has a second central fin height. In some embodiments, the first central fin height and the second central fin height are substantially equal to the first proximal fin height 226. In some embodiments, the initial first distal fin height 274 of the initial first distal fin 262 is reduced, such as by etching, to from a first distal fin 254 having a first distal fin height 224, as illustrated in FIG. 8. In some embodiments, the initial second distal fin height 276 of the initial second distal fin 263 is reduced, such as by etching, to from a second distal fin 255, having a second distal fin height 228. In some embodiments, a mask layer (not shown) is formed over the first proximal fin 252, the first central fin 273, the second central fin 271, and the second proximal fin 253 when forming the first distal fin 254 and the second distal fin 255. In some embodiments, the initial first distal fin height 274 and the initial second distal fin height 276 are reduced by removing the pad oxide 204, the nitride layer 206, the oxide layer 208, and the SiN cap (not shown). In some embodiments, first distal fin height 224 and the second distal fin height 228 are substantially the same. In some embodiments, the first distal fin height 224 is between about 15 nm to about 60 nm.

Figure 9:
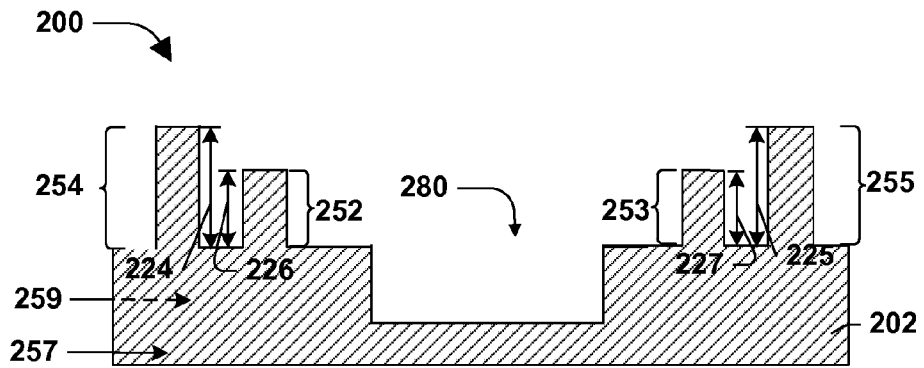
FIG. 9 is an illustration of a semiconductor device, according to some embodiments.
Figure 10:
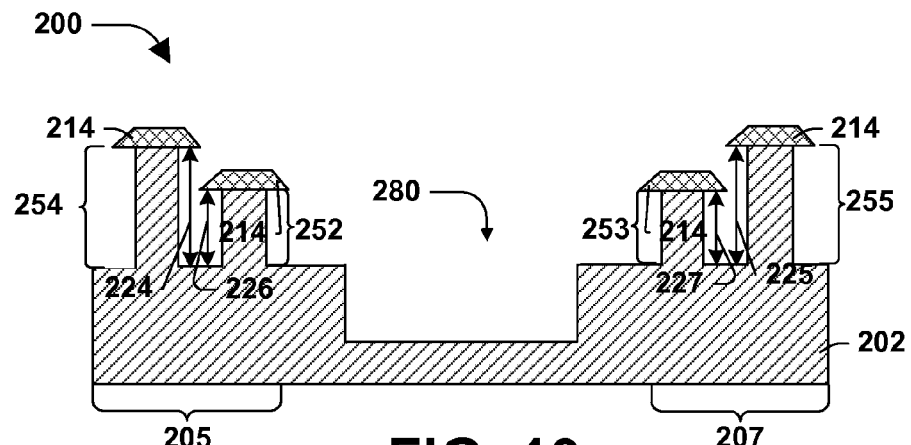
FIG. 10 is an illustration of a semiconductor device, according to some embodiments.
Figure 11:
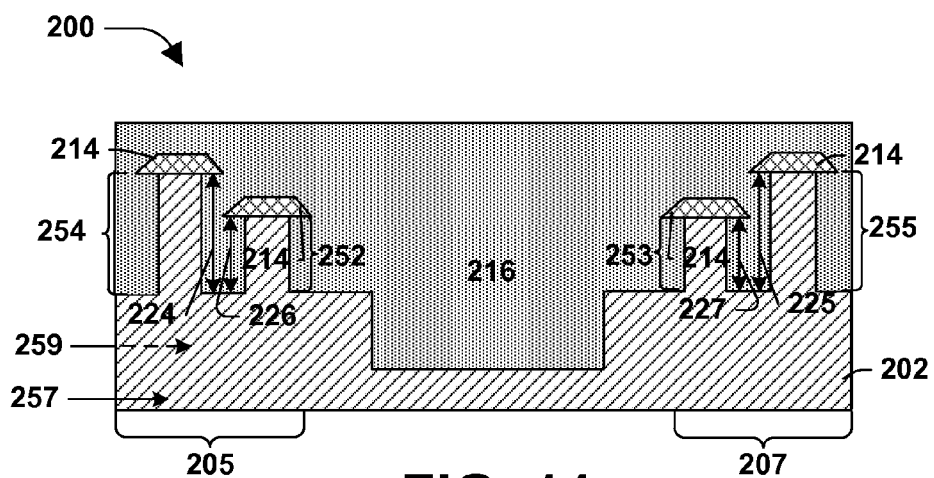
FIG. 11 is an illustration of a semiconductor device, according to some embodiments.
Figure 12:
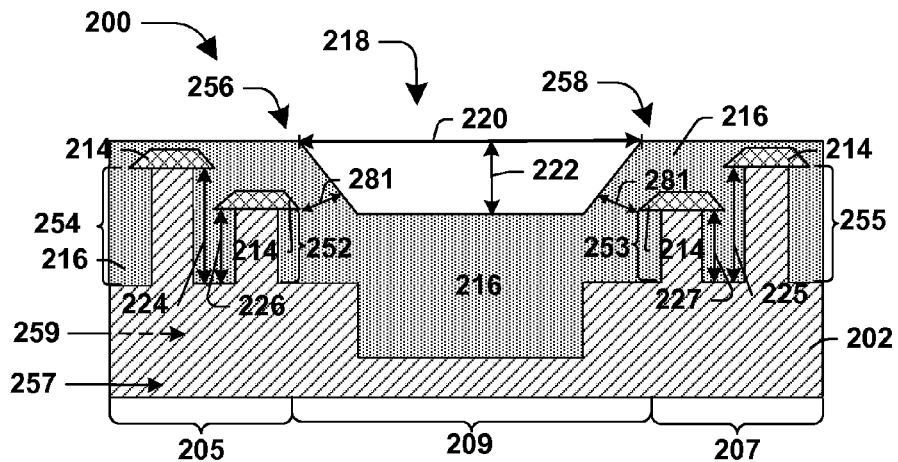
FIG. 12 is an illustration of a semiconductor device, according to some embodiments.
Figure 13:
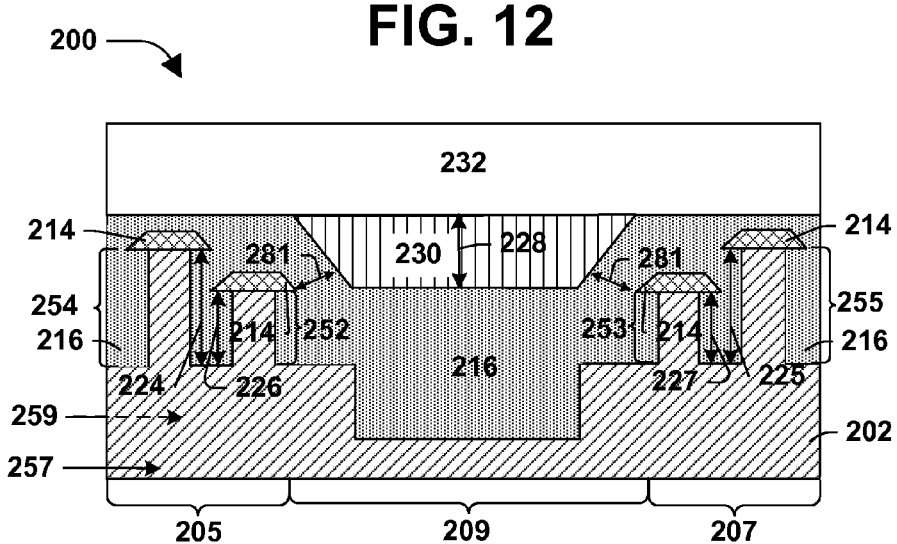
FIG. 13 is an illustration of a semiconductor device, according to some embodiments.

At 106, a shallow trench isolation STI region 209 is formed proximate the first proximal fin 252 and the second proximal fin 253, such that the first proximal fin 252 is adjacent a first side 256 of the STI region 209 and disposed between the STI region 209 and the first distal fin 254 and a second proximal fin 253 is adjacent a second side 258 of the STI region 209 and disposed between the STI region 209 and the second distal fin 255, as illustrated in FIG. 12. Turning to FIG. 9, the first central fin 273 and the second central fin 271 are removed, such as by etching, and a trench 280 is formed, such as by etching, between the first proximal fin 252 and the second proximal fin 253. In some embodiments, an epitaxial (Epi) cap 214 is formed over the first distal fin 254, the first proximal fin 252, the second proximal fin 253 and the second distal fin 255, as illustrated in FIG. 10. In some embodiments, the Epi cap 214 is grown. In some embodiments, the Epi cap 214 comprises at least one of a silicon, a nitride, or an oxide. In some embodiments, a first active region 205 comprises the first proximal fin 252 and the first distal fin 254. In some embodiments, a second active region 207 comprises the second proximal fin 253 and the second distal fin 255. In some embodiments, the first active region 205 comprises at least one of a source or a drain. In some embodiments, the second active region 207 comprises at least one of a source or a drain. In some embodiments, a metal connect 216 is formed over the first distal fin 254, the first proximal fin 252, the second proximal fin 253 and the second distal fin 255, as illustrated in FIG. 11. In some embodiments, an STI 231, as illustrated in FIG. 19, is formed adjacent a first side 257 of the metal connect 216 and adjacent a second side 259 of the metal connect 216 in the trench 280, where the arrow of 257 is in front of the substrate 202 and the arrow of 259 is behind the substrate 202. In some embodiment, STI 231 is formed in the trench 280, as illustrated in FIG. 10, before the metal connect 216 is formed, such that the metal contact is in contact with STI 231 (not shown) in the trench 280, rather than the substrate 202. In some embodiments, the metal connect 216 comprise a conductive material such at least one of a metal or polysilicon. In some embodiments, the metal connect 216 formation comprises deposition. In some embodiments, the metal connect 216 electrically connects the first active region 205 to the second active region 207. In some embodiments, the metal connect 216 connects a first drain to a second drain. In some embodiments, the metal connect 216 connects a first source to a second source. In some embodiments, a first opening 218 is formed in the metal connect 216, such as by etching, as illustrated in FIG. 12. In some embodiments, the first opening 218 has a first opening width 220 between about 20 nm to about 150 nm. In some embodiments, the first opening 218 has a first opening height 222 between about 20 nm to about 70 nm. In some embodiments, the first opening is a first distance 281 from the first proximal fin 252 and a first distance from the second proximal fin 253. In some embodiments, an oxide 230 is formed in the first opening 218, as illustrated in FIG. 13. In some embodiments, the oxide 230 is formed by filling the first opening 218 with a dielectric material, such as silicon oxide ($SiO_2$). In some embodiments, the oxide 230 formation comprises deposition of the dielectric material. In some embodiments, an STI region 209 comprises the oxide 230. In some embodiments, the oxide 230 has a first oxide height 228 between about 20 nm to about 70 nm. In some embodiments, the first oxide height 228 is substantially equal to a difference between the first proximal fin height 226 and the first distal fin height 224. In some embodiments, the first oxide height 228 is different than a difference between the first proximal fin height 226 and the first distal fin height 224. In some embodiments, the oxide 230 has a oxide 230 volume that is inversely proportional to the first proximal fin height 226. In some embodiments, the first distance 281 between the first proximal fin 252 and the oxide 230 remains constant, such that a oxide volume of an oxide decreases as the first proximal fin height 227 increases. In some embodiments, the oxide volume is between about 1.1 to about 1.5 times greater than a second oxide volume of an oxide, where the second oxide volume corresponds to the first proximal fin 252 having the first distal fin height 224. In some embodiments, a dielectric 232 is formed, such as by deposition, over the oxide 230 and the metal connect 216. In some embodiments, the dielectric 232 comprises a standard dielectric material with a medium or low dielectric constant, such as $SiO_2$.

Figure 14:
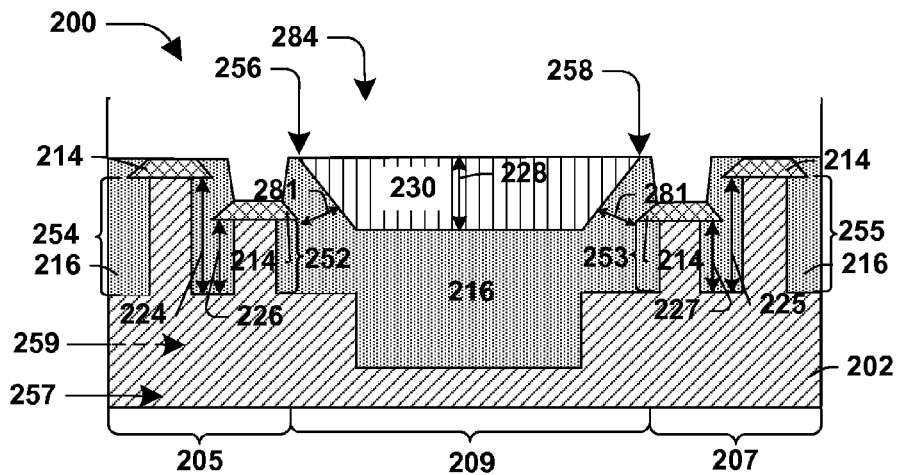
FIG. 14 is an illustration of a semiconductor device, according to some embodiments.
Figure 15:
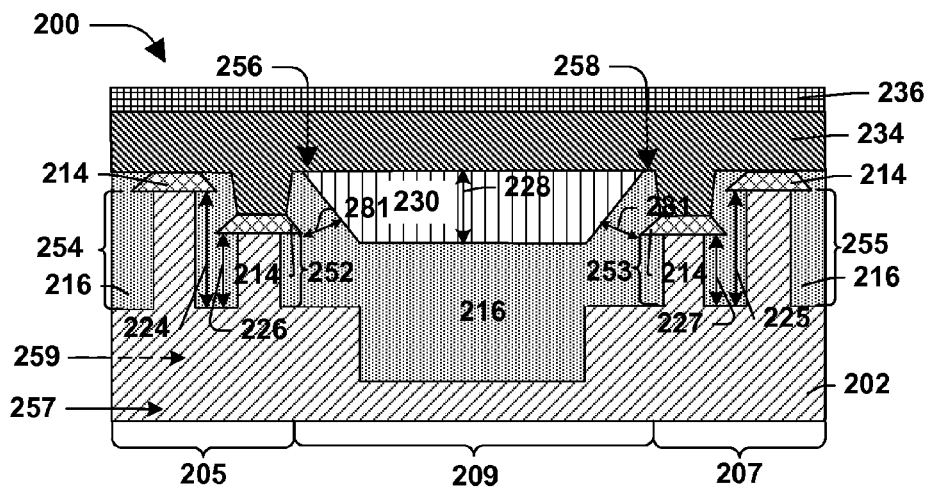
FIG. 15 is an illustration of a semiconductor device, according to some embodiments.
Figure 16:
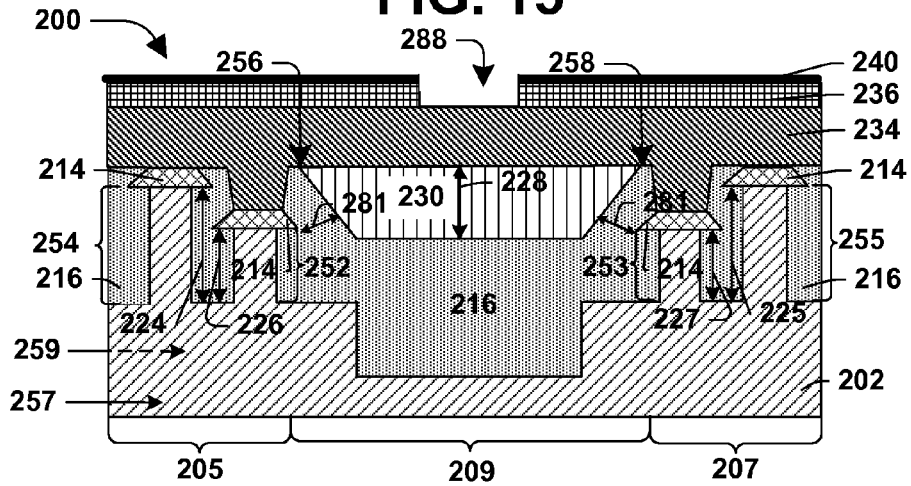
FIG. 16 is an illustration of a semiconductor device, according to some embodiments.

Turning to FIG. 14, which illustrates a cross-section of the second line 248 of FIG. 2, where the second line 248 cuts through the gate 234. According to some embodiments, the semiconductor device 200 is formed using the method 100, such that the gate 234 is formed after the formation of the STI region 209 at 106. In some embodiments, a second opening 284 is formed, such as by etching, over the oxide 230 and in the metal connect 216. In some embodiments, the second opening 284 is formed such that it exposes the Epi caps 214 over the first distal fin 254, the first proximal fin 252, the second proximal fin 253 and the second distal fin 255. In some embodiments, the gate 234 is formed in the second opening 284, such that the gate 234 is electrically connected to the Epi caps 214 over the first distal fin 254, the first proximal fin 252, the second proximal fin 253 and the second distal fin 255, as illustrated in FIG. 15. In some embodiments, the gate 234 comprises a layer of high dielectric constant material in contact with the Epi caps 214. In some embodiments, the high dielectric constant material comprises at least one of a nitride or an oxide. In some embodiments, the gate 234 comprises a conductive material, such as metal, formed, such as by deposition, over the high dielectric constant material. In some embodiments, a hard mask 236 is formed, such as by deposition, over the gate 234. In some embodiments, the hard mask 236 comprises an oxide. In some embodiments, an etch stop layer 240 is formed over the hard mask 236, as illustrated in FIG. 16. In some embodiments, the etch stop layer 240 comprises at least one of a silicon, a nitride or an oxide. In some embodiments, a third opening 288 is formed through the etch stop layer 240 and the hard mask 236 in the STI region 209. In some embodiments, the third opening 288 exposes a portion of the gate 234. In some embodiments a metal contact 238 is formed in the third opening 288, such that the metal contact 238 is electrically connected to the gate 236, as illustrated in FIG. 17. In some embodiments, the metal contact 238 comprises a conductive material, such as metal. In some embodiments, the metal contact 238 formation comprises deposition.

According to some embodiments, FIG. 18 illustrates a cross-section along the first line 246 of FIG. 2, where the first line 246 cuts through cuts through the metal connect 216 and illustrates the gate 234, the hard mask 236 and the metal contact 238 in phantom. According to some embodiments, FIG. 19 illustrates the cross-section along a third line 241 of FIG. 2, where the third line 241 cuts through the STI region 209. In some embodiments, the metal connect 216 is in contact with the substrate 202 and at least partially in the STI 231. In some embodiments, the metal contact 216 is in contact with STI 231 in the trench 280 (not shown), such that the STI 231 is over the substrate 202 in the trench 280. According to some embodiments, FIG. 20 illustrates a cross-section along the fourth line 242 of FIG. 2, where the fourth line 242 cuts through the first proximal fin 252 and the gate 234. In some embodiments, the metal connect 216 is in contact with the Epi cap 214, where the Epi cap 214 is in the first active region 205 and comprises at least one of a source or a drain. In some embodiments, the metal connect 216 is in contact with the Epi cap 214, where the Epi cap 214 is in the second active region 207 and comprises at least one of a source or a drain. In some embodiments, the metal connect 216 is in contact with the Epi caps 214 of the first active region and with the Epi caps 214 of the second active region 207, such that the metal connect 216 connects at least one of a source of the first active region 205 to a source of the second active region 207, a drain of the first active region 205 to a drain of the second active region 207, or a source of the first active region 205 to a drain of the second active region 207. According to some embodiments, FIG. 21 illustrates a cross-section along the fifth line 244 of FIG. 2, where the fifth line 244 cuts through the first distal fin 254 and the gate 234. The difference in height between the first proximal fin 252 and the first distal fin 254 is apparent between FIGS. 20 and 21.

According to some embodiments, a semiconductor device comprises a first active region adjacent a first side of a shallow trench isolation (STI) region. In some embodiments, the first active region comprises a first proximal fin adjacent the STI region and having a first proximal fin height, and a first distal fin adjacent the first proximal fin and having a first distal fin height. In some embodiments, the first proximal fin height is less than the first distal fin height. In some embodiments, the first proximal fin is disposed between the STI region and the first distal fin.

According to some embodiments, a method of forming a semiconductor device comprises forming a first active region and forming a shallow trench isolation (STI) region adjacent the active region. In some embodiments, forming the first active region comprises forming an initial first proximal fin, forming a first distal fin having a first distal fin height and reducing an initial first proximal fin height of the initial first proximal fin to form a first proximal fin having a first proximal fin height. In some embodiments, the first proximal fin height is less than the first distal fin height. In some embodiments, forming the STI region proximate the first proximal fin, such that the first proximal fin is adjacent a first side of the STI region and is disposed between the STI region and the first distal fin.

According to some embodiments, a semiconductor device comprises a first active region adjacent a first side of a shallow trench isolation (STI) region and a second active region adjacent a second side of the STI region. In some embodiments, the first active region comprises a first proximal fin adjacent the STI region and having a first proximal fin height, and a first distal fin adjacent the first proximal fin and having a first distal fin height. In some embodiments, the first proximal fin height is less than the first distal fin height. In some embodiments, the first proximal fin is disposed between the STI region and the first distal fin. In some embodiments, the second active region comprises a second proximal fin adjacent the STI region and having a second proximal fin height, and a second distal fin adjacent the second proximal fin and having a second distal fin height. In some embodiments, the second proximal fin height is less than the second distal fin height. In some embodiments, the second proximal fin is disposed between the STI region and the second distal fin.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device comprising:
a first active region adjacent a first side of a shallow trench isolation (STI) region, the first active region comprising:
   a first proximal fin adjacent the STI region and having a first proximal fin height, the first proximal fin being a first projection of a substrate; and
   a first distal fin adjacent the first proximal fin and having a first distal fin height, the first distal fin being a second projection of the substrate, the first proximal fin height less than the first distal fin height, the first proximal fin disposed between the STI region and the first distal fin.

2. The semiconductor device of claim 1, comprising:
a second active region adjacent a second side of the STI region, the second active region comprising:
   a second proximal fin adjacent the STI region and having a second proximal fin height, the second proximal fin being a third projection of the substrate; and
   a second distal fin adjacent the second proximal fin and having a second distal fin height, the second distal fin being a fourth projection of the substrate, the second proximal fin height less than the second distal fin height, the second proximal fin disposed between the STI region and the second distal fin.

3. The semiconductor device of claim 2, comprising:
a metal connect in contact with the first distal fin, the first proximal fin, the second proximal fin and the second distal fin; and
an oxide disposed within the STI region and over a portion of the metal connect.

4. The semiconductor device of claim 3, the oxide having an oxide height substantially equal to a difference between the first proximal fin height and the first distal fin height.

5. The semiconductor device of claim 2, comprising an epitaxial (Epi) layer over the first proximal fin, the first distal fin, the second proximal fin and the second distal fin.

6. The semiconductor device of claim 1, comprising a dielectric over the STI region.

7. The semiconductor device of claim 1, the STI region comprising an oxide having an oxide volume that is inversely proportional to the first proximal fin height.

8. The semiconductor device of claim 7, the oxide volume between about 1.1 to about 1.5 times greater than a second oxide volume of the oxide, where the second oxide volume corresponds to the first proximal fin having the first distal fin height.

9. The semiconductor device of claim 1, comprising a gate over the first active region, the STI region and a second active region adjacent a second side of the STI region.

10. A semiconductor device comprising:
a first active region adjacent a first side of a shallow trench isolation (STI) region, the first active region comprising:
   a first proximal fin adjacent the STI region and having a first proximal fin height, the first proximal fin being a first projection of a substrate; and
   a first distal fin adjacent the first proximal fin and having a first distal fin height, the first distal fin being a second projection of the substrate, the first proximal fin height less than the first distal fin height, the first proximal fin disposed between the STI region and the first distal fin; and
a second active region adjacent a second side of the STI region, the second active region comprising:
   a second proximal fin adjacent the STI region and having a second proximal fin height, the second proximal fin being a third projection of the substrate; and
   a second distal fin adjacent the second proximal fin and having a second distal fin height, the second distal fin being a fourth projection of the substrate, the second proximal fin height less than the second distal fin height, the second proximal fin disposed between the STI region and the second distal fin.

11. The semiconductor device of claim 10, a metal connect in contact with the first distal fin, the first proximal fin, the second proximal fin, and the second distal fin and extending through the STI region.

12. The semiconductor device of claim 10, comprising an epitaxial (Epi) layer over the first proximal fin, the first distal fin, the second proximal fin and the second distal fin.

13. The semiconductor device of claim 12, comprising a gate in contact with the Epi layer.

14. The semiconductor device of claim 10, comprising a dielectric over the STI region.

15. A semiconductor device comprising:
a first active region having a first proximal fin, the first proximal fin being a first projection of a substrate;
a second active region having a second proximal fin, the second proximal fin being a second projection of the substrate;
a metal connect coupling a source/drain region of the first active region to a source/drain region of the second active region; and
a shallow trench isolation (STI) region between the first proximal fin and the second proximal fin, the metal connect extending through the STI region, the STI region comprising an oxide over a first portion of the metal connect, a top surface of the oxide co-planar with a top surface of a second portion of the metal connect.

16. The semiconductor device of claim 15, the first proximal fin having a first proximal fin height and the first active region comprising:
a first distal fin having a first distal fin height, the first proximal fin height less than the first distal fin height, the first proximal fin disposed between the first distal fin and the STI region.

17. The semiconductor device of claim 16, the metal connect in contact with the first proximal fin and the first distal fin.

18. The semiconductor device of claim 16, the oxide having an oxide height substantially equal to a difference between the first proximal fin height and the first distal fin height.

19. The semiconductor device of claim 15, comprising a gate extending over the oxide and coupled to the first active region and the second active region.

20. The semiconductor device of claim 15, the metal connect in contact with the first proximal fin and the second proximal fin.

\* \* \* \* \*